United States Patent [19]

Kagami

[11] Patent Number: 5,563,832
[45] Date of Patent: Oct. 8, 1996

[54] SEMICONDUCTOR MEMORY DEVICE HAVING INTERFACE UNITS MEMORIZING AVAILABLE MEMORY CELL SUB-ARRAYS

[75] Inventor: Akihiko Kagami, Tokyo, Japan

[73] Assignee: NEC Corporation, Tokyo, Japan

[21] Appl. No.: 331,113

[22] Filed: Oct. 28, 1994

[30] Foreign Application Priority Data

Oct. 29, 1993 [JP] Japan ................................ 5-271110

[51] Int. Cl.$^6$ ............................ G11C 8/00; G11C 29/00
[52] U.S. Cl. .................... 365/200; 365/189.07; 365/201; 365/225.7; 365/230.03; 365/230.08
[58] Field of Search ...................... 365/200, 201, 365/230.08, 225.7, 189.11, 189.07, 195, 230.03

[56] References Cited

U.S. PATENT DOCUMENTS

| | | | |
|---|---|---|---|
| 5,287,326 | 2/1994 | Hirata | 365/189.07 X |
| 5,293,348 | 3/1994 | Abe | 365/200 X |
| 5,392,242 | 2/1995 | Koike | 365/230.08 X |
| 5,426,606 | 6/1995 | Takai | 365/230.08 X |

FOREIGN PATENT DOCUMENTS 61-17299  1/1986  Japan .
1-31696   6/1989  Japan .

*Primary Examiner*—Do Hyun Yoo
*Attorney, Agent, or Firm*—Sughrue, Mion, Zinn, Macpeak & Seas

[57] ABSTRACT

A semiconductor memory device has address buffer circuits operative to produce address predecoded signals for enabling an addressing system to selectively make memory cell sub-arrays accessible, a prohibit circuit operative to fix address predecoded signal or signals to inactive level for prohibiting the associated memory cell sub-arrays from a service as a data storage and an information storage circuit for storing pieces of test information indicative of the memory cell sub-arrays prohibited from the service, and a manufacturer easily groups the products by the available memory cell sub-arrays after package of the products.

6 Claims, 5 Drawing Sheets

5,563,832

1

SEMICONDUCTOR MEMORY DEVICE HAVING INTERFACE UNITS MEMORIZING AVAILABLE MEMORY CELL SUB-ARRAYS

FIELD OF THE INVENTION

This invention relates to a semiconductor memory device and, more particularly, to a semiconductor memory device having interface units memorizing available memory cell sub-arrays.

DESCRIPTION OF THE RELATED ART

A large number of memory cells are integrated on a semiconductor chip for forming a semiconductor memory device, however, a single a defective memory cell causes the manufacturer to reject the entire semiconductor memory device. A redundant technology rescues the defective products from the rejection, and enhances the production yield. The redundant technology forms redundant memory cells and a redundant circuit for storing an address assigned to defective memory cells in the semiconductor memory device, and allows the manufacturer to replace defective memory cells with the redundant memory cells. The redundant technology has been applied to the semiconductor random access memory device from 256 kilo-bit model.

Another rescuing technology aims to enhance a total production yield of various models of a semiconductor memory device. In detail, a manufacturer is assumed to product a 16 mega-bit random access memory device. The random access memory device can provide 16 mega-bit data storage to a user. However, some user may not need the full capacity of the random access memory device. For example, a particular user may need only 12 mega-bit data storage, while a 10 mega-bit data storage may satisfy another user. If so, defective products with 1 mega-bit defective cells are sufficient to these users, and the defective products enhance the total production yield of the random access memory device.

In order to remodel the defective products into a small-capacity random access memory device in good quality, Japanese Patent Publication of Unexamined Application No. 61-17299 discloses an address buffer circuit for preventing a defective memory cell sub-array from a data access.

FIG. 1 illustrates the address buffer circuit 1 associated with a protective circuit 2 for an address pin An. The address pin An is coupled to a protective resistor R1, and the protective circuit 2 implemented by a field effect transistor Q1 is coupled between the resistor R1 and a ground voltage line GND.

The address buffer circuit 1 comprises a three inverters INV1, INV2 and INV3 coupled between a positive power voltage line Vdd and the ground voltage line GND and two fuse elements F1 and F2, and the inverters INV1, INV2 and INV3 are implemented by depletion type/enhancement type field effect transistors Qd2/Qe3, Qd4/Qe5 and Qd6/Qe7. The fuse elements F1 and F2 are inserted between the depletion type field effect transistor Qd4 and the enhancement type field effect transistor Qe5 and between the depletion type field effect transistor Qd6 and the enhancement type field effect transistor Qe7, respectively. The gate electrodes of the depletion type field effect transistors Qd2, Qd4 and Qd6 are respectively connected to the output nodes N1, N2 and N3 of the inverters INV1 to INV3, and the resistor R1 and the output nodes N1 and N2 are respectively coupled to the gate electrodes of the enhancement type field effect transistors Qe3, Qe5 and Qe7 serving as input nodes of the inverters INV1 to INV3. The output node N3 serves as an output node of the address buffer circuit 1, and an address signal A0 is supplied from the output node N3 to an addressing system (not shown).

An external address bit supplied to the address pin An is indicative of either half of the memory cell array (not shown). If one of the halves of the memory cell arrays contains defective memory cells and the other half can satisfy a user, the manufacturer breaks one of the fuse elements F1/F2, and fixes the address signal A0 to one of the two levels.

For example, when the defective half is selective by the address signal A0 of the low level, the fuse element F2 is broken, and the depletion type field effect transistor Qd6 fixes the address signal A0 to the high level. As a result, the operational half is accessed at all times regardless of the external address bit at the address pin An.

On the other hand, if the defective half is specified by the address signal of the high level, the fuse element F1 is broken, and the other fuse element couples the output node N3 to the enhancement type field effect transistor Qe7. The positive high voltage level Vdd is supplied through the depletion type field effect transistor Qd4 regardless of the external address bit at the address pin An, and the enhancement type field effect transistor Qe7 is turned on at all times. As a result, the address signal A0 is fixed to the low level, and the operational half is accessed at all times.

When the memory cell array is operational, fuse elements F1 and F2 are never broken, and the address signal A0 is changed depending upon the external address bit at the address pin An.

If the memory cell array is divided into quarters, the pair of fuse elements F1 and F2 are incorporated in each of the two address buffer circuits, and the manufacturer selectively uses the quarters of the memory cell array.

The manufacturer checks the memory cell array to see whether or not a part of the memory cell array contains defective memory cells through a multi-bit test sequence. The memory cell array is usually divided into four or a multiple of four, and a diagnostic system selects a row of memory cells from one of the memory cell sub-arrays in the multi-bit test sequence. A built-in comparator compares test bits read-out from the selected memory cells to see whether the test bits are consistent with one another or not, and reports a diagnosis to the diagnostic system. The multi-bit test sequence accelerates the diagnosis for each product.

However, a problem is encountered in the prior art semiconductor memory device in that classification of the defective products consumes long time period. This is because of the fact that the diagnostic system only identifies the address of defective memory cells, but not the memory cell sub-array. The manufacturer needs to classify available memory cell sub-arrays on the basis of the addresses of the defective memory cells, and the classification is time consuming.

SUMMARY OF THE INVENTION

It is therefore an important object of the present invention to provide a semiconductor memory device a defective memory cell sub-array of which is easily discriminated by a manufacturer.

To accomplish the object, the present invention proposes to store pieces of information for available memory cell sub-arrays in interface circuits.

In accordance with the present invention, there is provided a semiconductor memory device comprising: a)

memory cell array divided into a plurality of memory cell sub-arrays each implemented by a plurality of addressable memory cells for storing data bits, respectively; b) a plurality of interface circuits respectively coupled to signal pins for communicating the outside of the semiconductor memory device, and having first interface circuits operative to produce first internal signals for selectively enabling the plurality of memory cell sub-arrays to be accessible, second interface circuits operative to produce second internal signals for enabling the plurality of addressable memory cells to be accessible and at least one third interface circuit for a data signal; c) an addressing system responsive to the first internal signals and the second internal signals for selectively coupling the addressable memory cells of the memory cell array to the at least one third interface circuit for delivering the data signal; and d) a plurality of information storage circuits sharing the signal pins with predetermined interface circuits selected from the plurality of interface circuits, and respectively associated with the plurality of memory cell sub-arrays for storing pieces of test information of the memory cell sub-array or sub-arrays prohibited from the service as the data storage.

BRIEF DESCRIPTION OF THE DRAWINGS

The features and advantages of the semiconductor memory device according to the present invention will be more clearly understood from the following description taken in conjunction with the accompanying drawings in which.

DESCRIPTION OF THE PREFERRED EMBODIMENT

Figure 1:
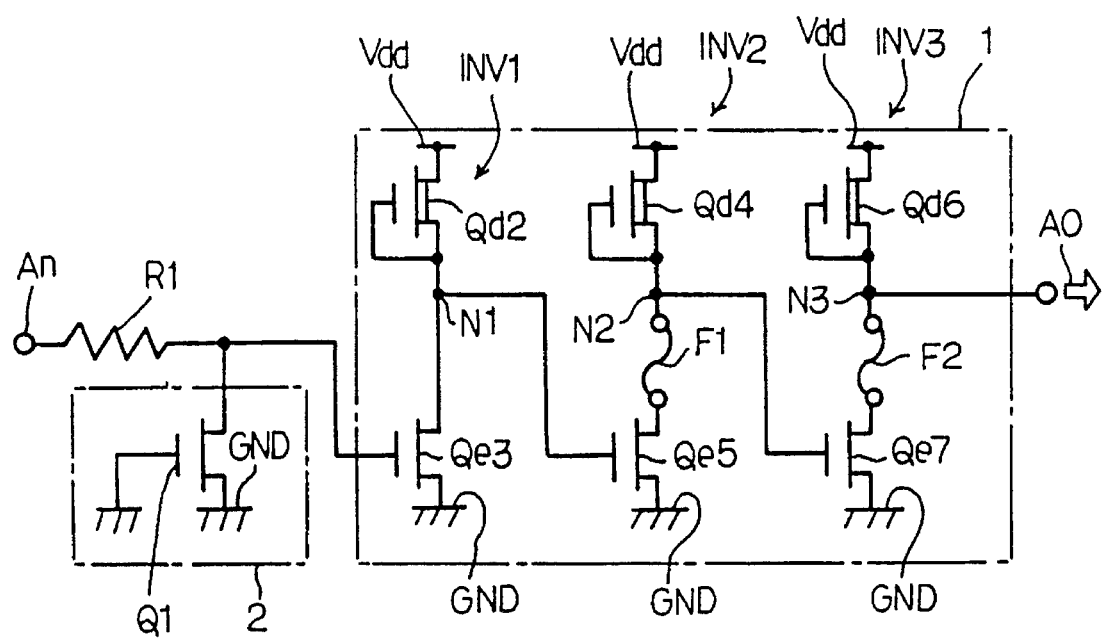
FIG. 1 is a circuit diagram showing the address buffer circuit incorporated in the prior art semiconductor memory device.
Figure 2:
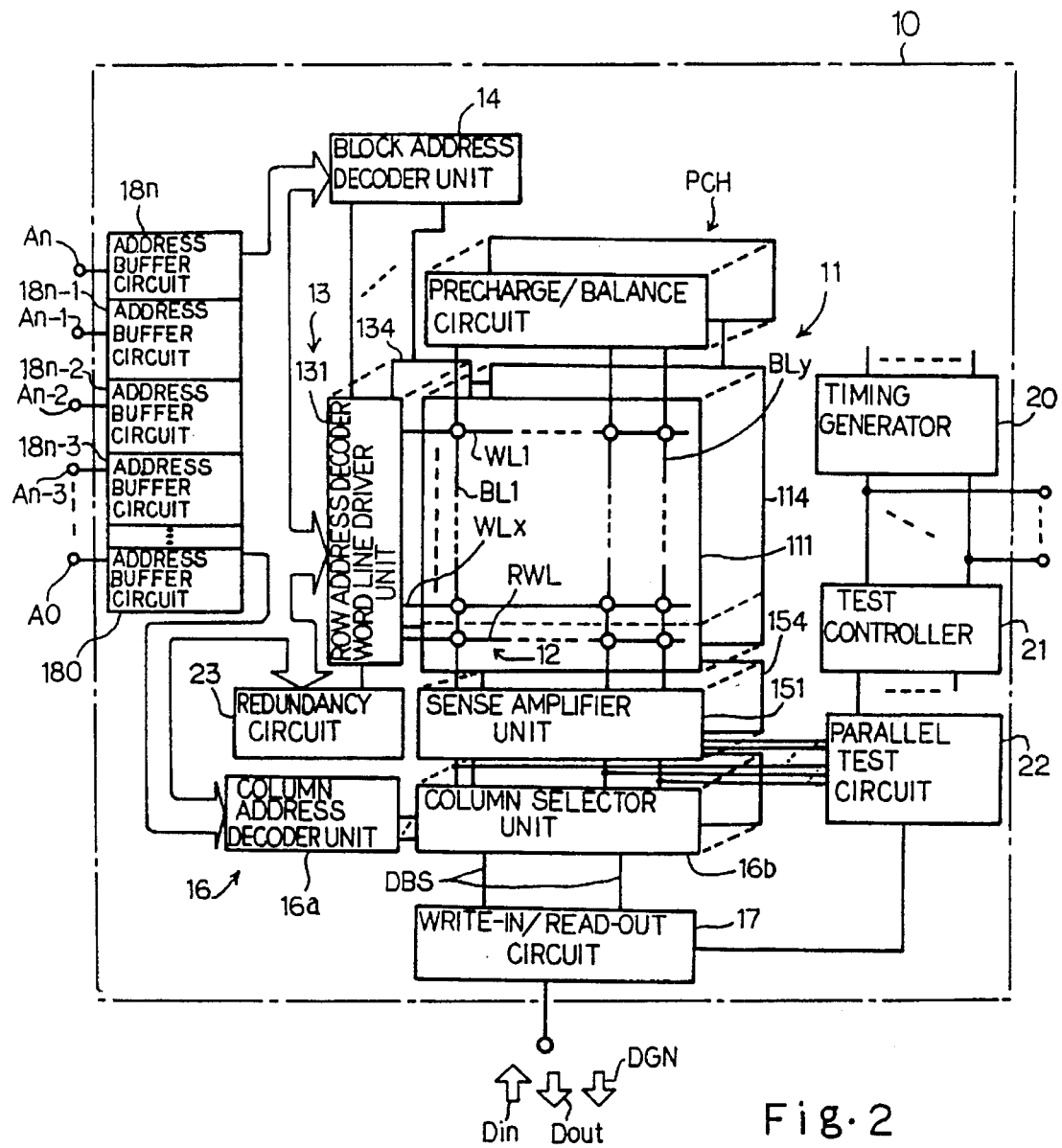
FIG. 2 is a circuit diagram showing the arrangement of a semiconductor dynamic random access memory device according to the present invention.

Referring to FIG. 2 of the drawings, a semiconductor dynamic random access memory device embodying the present invention is fabricated on a single semiconductor chip 10, and selectively enters into a standard mode and a diagnostic mode. In the standard mode, the semiconductor dynamic random access memory device selectively carries out a write-in sequence, a read-out sequence and a refreshing sequence. On the other hand, the semiconductor dynamic random access memory device is coupled to a diagnostic system (not shown) in the diagnostic mode, and internally carries out various test sequences. One of the test sequence is known as a parallel test sequence as will be described hereinlater.

The dynamic random access memory device comprises a memory cell array 11 divided into a plurality of memory cell sub-arrays 111 to 114. Each of the memory cell sub-arrays 111 to 114 is implemented by a plurality of memory cells represented by small circles, and block addresses are respectively assigned to the memory cell sub-arrays 111 to 114. A row of memory cells serves as a redundant memory cell column 12, and a defective row of memory cells is replaceable with the redundant row of memory cell 12. The other rows of memory cells of each memory cell sub-array serve as regular rows of memory cells. The memory cells store data bits in the form of electric charge, respectively.

The semiconductor dynamic random access memory device further comprises a plurality of sets of bit line pairs BL1 to BLy, and each set of bit line pairs BL1 to BLy are coupled to the columns of memory cells and the redundant memory cells 12. The bit line pairs BL1 to BLy propagate data bits in the form of potential difference. Column addresses are respectively assigned to the bit line pairs BL1 to BLy.

The semiconductor dynamic random access memory device further comprises a plurality of precharge/balance circuits PCH respectively associated with the sets of bit line pairs BL1 to BLy, and the plurality of precharge/balance circuits PCH charge and balance the sets of bit line pairs BL1 to BLy at an intermediate voltage level after the write-in sequence or the read-out sequence is completed.

The semiconductor dynamic random access memory device further comprises a row addressing system 13, and the row addressing system 13 comprises a plurality of row address decoder/word line driver units 131 to 134 respectively associated with the memory cell sub-arrays 111 to 114 and a plurality of sets of regular/redundant word lines WL1 to WLx and RWL also respectively associated with the memory cell sub-arrays 111 to 114. Row addresses are respectively assigned to the regular word lines WL1 to WLx. The word lines WL1 to WLx are coupled to the regular rows of regular memory cells of the associated memory cell sub-array, respectively, and the redundant word line RWL is coupled to the redundant row of memory cells. The associated row address decoder/word line driver unit boosts one of the regular/redundant word lines WL1 to WLx and RWL over a positive power voltage level Vdd. Then, the electric charges stored in the regular/redundant rows of memory cells produce potential differences on the regular bit line pairs BL1 to BLy.

The semiconductor dynamic random access memory device further comprises a block address decoder unit 14, and the block address decoder unit 14 is responsive to internal block address signals for selectively enabling the row address decoder/word line driver units 131 to 134. One of the row address decoder/word line driver units 131 to 134 enabled by the block address decoder unit 14 becomes responsive to internal row address signals, and selectively boosts the associated regular/redundant word lines WL1 to WLx and RWL.

The semiconductor dynamic random access memory device further comprises a plurality of sense amplifier units 151 to 154 respectively associated with the sets of bit line pairs BL1–BLy, and the sense amplifier units 151 to 154 develop the potential differences on the associated bit line pairs BL1–BLy.

The semiconductor dynamic random access memory device further comprises a column addressing system 16, and the column addressing system 16 has a column address decoder unit 16a and a plurality of column selector units 16b. The column address decoder unit 16a is responsive to internal column address signals for coupling one of the bit line pairs BL1–BLy through the column selector units 16b to a data bus DBS. The potential difference on the selected bit line is transferred through the column selector units 16b to the data bus DBS.

In this instance, the row addressing system 13, the block address decoder unit 14 and the column addressing system 16 as a whole constitute an addressing system.

A write-in/read-out circuit 17 is coupled to the data bus DBS, and produces a potential difference on the data bus from an input data signal Din in the write-in sequence, an output data signal Dour from the potential difference on the data bus DBS in the read-out sequence and a diagnostic signal DGN in the parallel test sequence. In this instance, the write-in/read-out circuit 17 serves as a third interface.

The semiconductor dynamic random access memory device further comprises a plurality of address buffer circuits 180, . . . 18n-3, 18n-2, 18n-1 and 18n respectively coupled to address pins A0, . . . , An-3, An-2, An-1 and An, and the address buffer circuits 180 to 18n are shared between the block address decoder unit 14, the row address decoder/word line driver units 131 to 134 and the column address decoder unit 16a. In this instance, block and row address bits are firstly supplied to the address pins A0 to An, and column address bits are, thereafter, supplied to the address pins A0 to An. The row address bits are transferred from the address pins A0 to An-2 to the associated address buffer circuits, and the block address bits are transferred from the address pins An-1 and An to the address buffer circuits 18n-1 and 18n.

In this instance, the address buffer circuits 18n-1 to 18n serve as first interface circuits, and the other address buffer circuits serve as second interface circuits.

Figure 3:
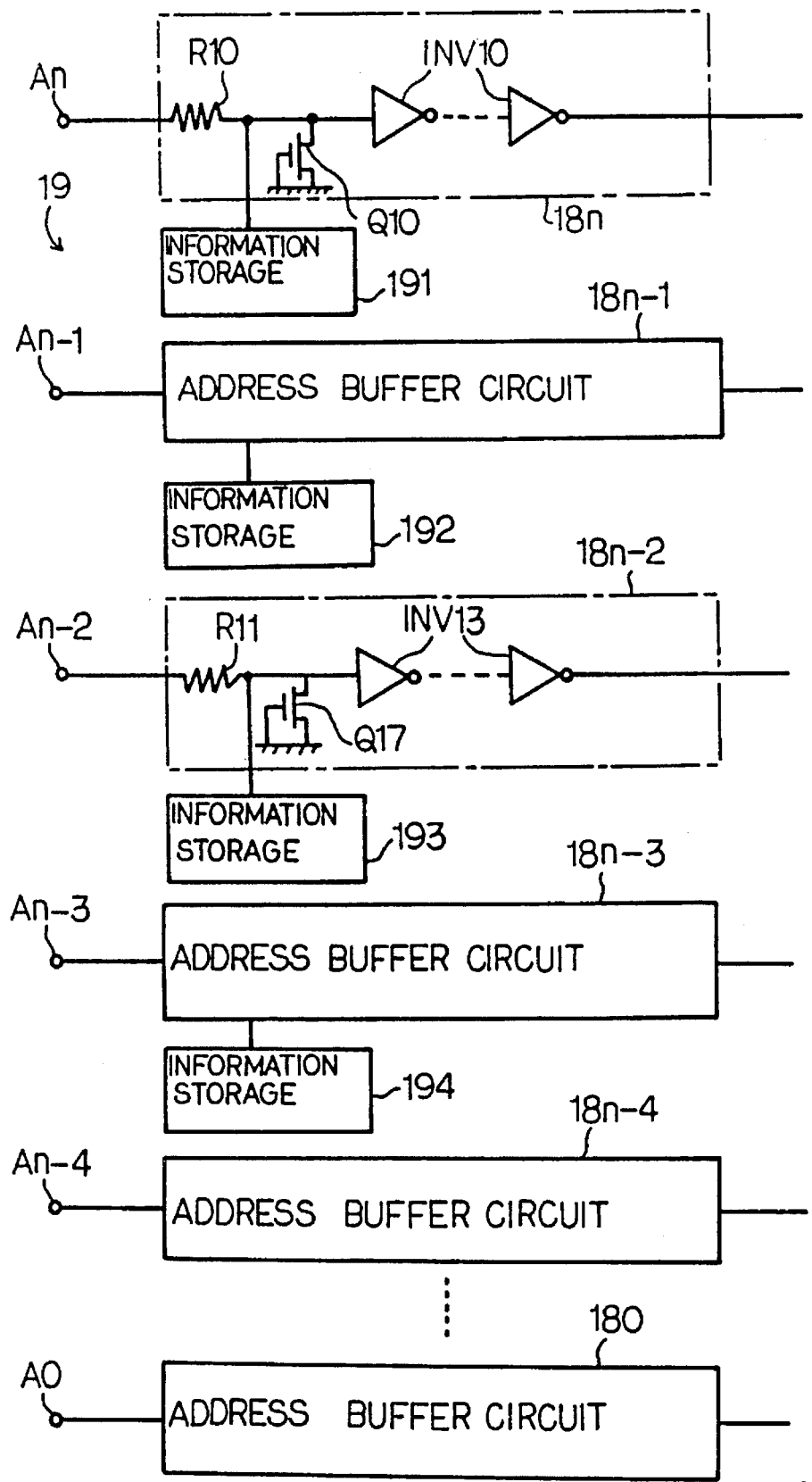
FIG. 3 is a circuit diagram showing the arrangement of an address buffer circuit incorporated in the semiconductor dynamic random access memory device.

As shown in FIG. 3 of the drawings, each of the address buffer circuits 18n-1 and 18n comprises a protective resistor R10 coupled to the associated address pin An-1 or An, a protective field effect transistor Q10 coupled between the protective resistor R10 and a ground voltage line and inverters INV10.

The address buffer circuit 18n-1 produces the internal block address signal for selecting one of the memory cell sub-arrays 111 and 112, and the address bit stored in the other address buffer circuit 18n is indicative of one of the memory cell sub-arrays 113 and 114.

Each of the address buffer circuits 180 to 18n-2 has a protective resistor R11, a protective field effect transistor Q17 and a series of inverters INV13, and changes the internal row address signal depending upon the address bit applied to the associated address pin.

The address buffer circuits 180 to 18n further produce the internal column address signals.

The semiconductor dynamic random access memory device further comprises an information storage circuit 19 implemented by four information storages 191 to 194 respectively associated with the memory cell sub-arrays 111 to 114, and the four information storages 191 to 194 stores pieces of information whether or not the associated memory cell sub-arrays 111 to 114 contain the defective memory cell or cells.

The information storages 191 to 194 share the address pins An-3 to An with the address buffer circuits 18n-3 to 18n, and the address buffer circuits 18n-3 to 18n serve as third interface circuits in this instance.

Figure 4:
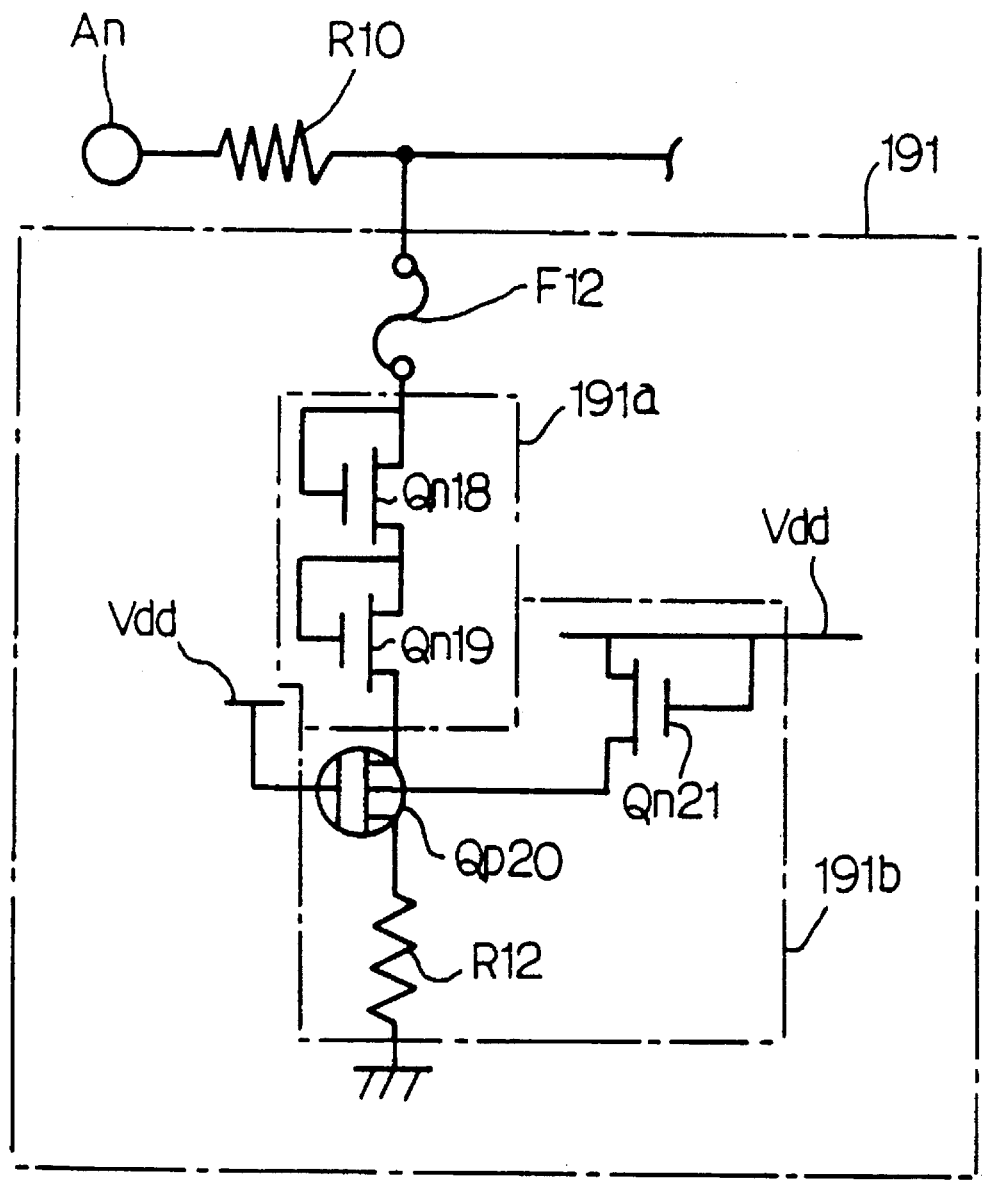
FIG. 4 is a circuit diagram showing the arrangement of a memory circuit incorporated in the address buffer circuit.

The information storages 191 to 194 are identical in arrangement to one another, and one 191 of the information storages is illustrated in FIG. 4 of the drawings. The information storage 191 comprises a fuse element F12 coupled through the protective resistor R10 or R11 to the address pin An, a step-down circuit 191a coupled to the fuse element F12 and a comparator 191b operative to compare the step-down voltage at the output node of the circuit 191 with the positive power voltage level.

The step-down circuit 191a is implemented by a series of n-channel enhancement type load transistors Qn18 and Qn19, and steps down the voltage level at the output node of the fuse element F12 by twice as large as the threshold of the n-channel enhancement type load transistor. The comparator 191b comprises a p-channel enhancement type field effect transistor Qp20 coupled at the drain node thereof to the step-down circuit 191a and at the gate electrode to the positive power voltage line Vdd, an n-channel enhancement type load transistor Qn21 coupled between the positive power voltage line Vdd and the channel region of the p-channel enhancement type field effect transistor Qp20 and a resistor R12 coupled between the source node of the p-channel enhancement type field effect transistor Qp20 and the ground voltage line.

While the address pin An is changed by the address bit between the positive power voltage level Vdd and the ground voltage level, the drain node of the p-channel enhancement type field effect transistor Qp20 never exceeds the positive power voltage level due to the step-down circuit, and the p-channel enhancement type field effect transistor Qp20 isolates the associated address buffer circuit 18n from the ground voltage line.

However, if an extremely high voltage level higher than the positive power voltage level Vdd by at least three times of the threshold, the p-channel enhancement type field effect transistor Qp20 turns on, and provides a current path from the step-down circuit 191a to the ground voltage line.

Another semiconductor memory device according to the present invention may have an information storage circuit disclosed in Japanese Patent Publication of Examined Application No. 1-31696. The information storage circuit has two diode-coupled transistors arranged in series and coupled to an input terminal for a TTL-level signal and a fuse element, and a test voltage is applied to the input terminal to see whether or not current flows.

Turning back to FIG. 2 of the drawings, the semiconductor dynamic random access memory device further comprises a timing generator unit 20 coupled to control signal pins, and the timing generator unit 20 is responsive to external control signals such as, for example, a row address strobe signal, a column address strobe signal and a write enable signal for sequentially producing internal control signals. The internal control signals enable the other circuits and units such as the row address decoder/word line driver unit 131 to 134, the sense amplifier units 151 to 154, the column address decoder unit 16a, the write-in/read-out circuit 17 and the precharge/balance circuit PCH, and control the read-out sequence and the write-in sequence.

The semiconductor dynamic random access memory device further comprises a test controller 21 coupled to some of the control signal pins, and discriminates a request for a test sequence in the diagnostic mode. When the test controller 21 determines a requested test, the test controller 21 selectively produces internal test control signals for the requested test sequence. One of the tests is known as a parallel bit test, and an external diagnostic system (not shown) diagnoses whether or not the memory cell array 11 contains a defective memory cell through the parallel test sequence.

The semiconductor dynamic random access memory device further comprises a parallel test circuit 22, and the parallel test circuit 22 compares read-out test bits to see whether or not at least one test bit is opposite in logic level to the other test bits. Namely, in the parallel bit test sequence, the diagnostic system writes a test bit of either logic level into the memory cells, and, thereafter, reads out the test bits from each row of memory cells by controlling the address bits. After the sense amplification, the parallel test circuit 22 compares the read-out test bits are compared with one another. If the read-out test bits are matched with one another, the row of memory cells is excellent, and the parallel test circuit 22 causes the write-in/read-out circuit 17 to produces the diagnostic signal DGN indicative of the excellent row. On the other hand, if at least one read-out test bit is opposite to the other read-out test bits, the parallel test circuit 22 causes the write-in/read-out circuit 17 to produce the diagnostic signal DGN indicative of a defective row. The diagnostic system determines the row address of the defective row and the block address of the memory cell sub-array on the basis of the address bits at the diagnostic signal indicative of the defective row.

The semiconductor dynamic random access memory device further comprises a redundancy circuit 23, and the redundant circuit 23 stores the block and row addresses of the defective row of memory cells in a non-volatile manner. In the standard mode, the block and row addresses are compared with the stored block and row addresses, and causes the row address decoder/word line driver units 131 to 134 to boost the redundant word lines RWL instead of the defective word lines upon coincidence.

Figure 5:
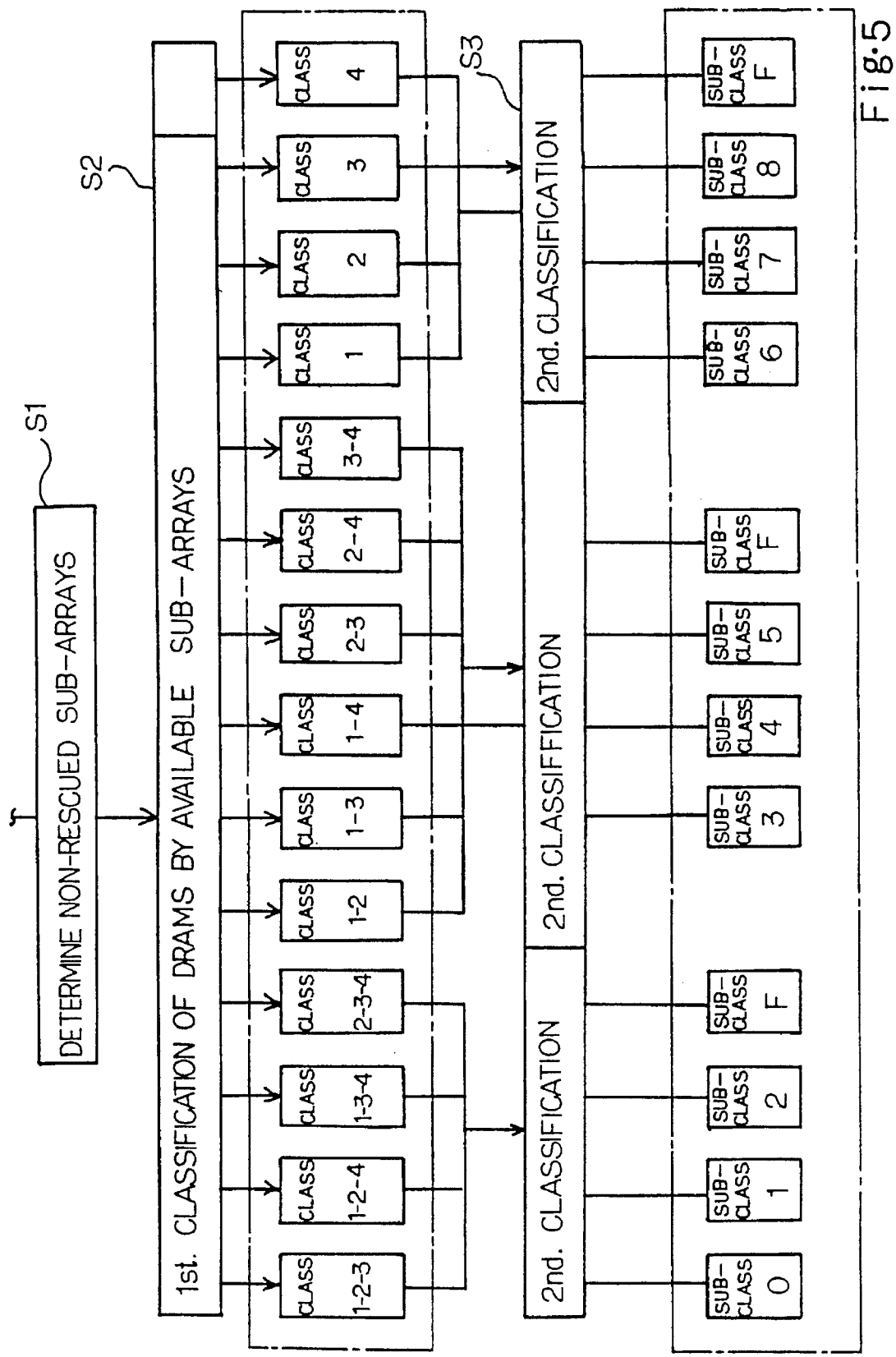
FIG. 5 is a view showing a rescuing sequence for the semiconductor dynamic random access memory device according to the present invention.

Description is hereinbelow made on a inspection/classification work on the semiconductor dynamic random access memory device with reference to FIG. 5 of the drawings. Upon completion of the fabrication process, the semiconductor dynamic random access memory devices are arranged on a semiconductor wafer, and the diagnostic system (not shown) is successively coupled to the semiconductor dynamic random access memory devices for the tests.

If a defective row is found in a semiconductor dynamic random access memory device, the block and row addresses of the defective row are memorized in the redundancy circuit 23, and the semiconductor dynamic random access memory device is rescued from the rejection. However, if another semiconductor dynamic random access memory device has defective rows more than the redundant rows, the redundant rows can not rescue the semiconductor dynamic random access memory device, and the fuses F12 are broken for indicating the memory cell sub-array or sub-arrays containing the defective rows.

When the diagnosis is completed on the semiconductor dynamic random access memory devices on the wafer, the wafer is separated into chips where the semiconductor dynamic random access memory devices are integrated, and the chips are assembled with appropriate lead frames. Thereafter, the chips assembled with the lead frames are sealed in packages.

An access time is measured for the semiconductor dynamic random access memory devices, and the diagnostic system determines guaranteed access speed for each of the semiconductor dynamic random access memory devices.

The semiconductor dynamic random access memory device are further subjected to other tests. However, description is omitted, because the other tests are not important for understanding the gist of the present invention.

After the packaging, the semiconductor dynamic random access memory devices are successively coupled to a simple tester (not shown) except for the non-defective memory devices and the defective devices rescued by the redundant rows. The tester applies a test voltage higher than the positive power voltage level Vdd by three times as high as the threshold to the address pins An-3 to An. If the fuse F12 is broken, the test voltage is applied to the gate electrode of the enhancement type field effect transistor Qe12 or the corresponding transistor of the inverter INV13, and current does not flow. However, if the fuse F12 is still connected between the protective resistor R10/R11 and the step-down circuit 191a, the step-down test voltage is higher than the positive power voltage level Vdd by the threshold of the p-channel enhancement type field effect transistor Qp20, and the p-channel enhancement type field effect transistor Qp20 discharges the current to the ground voltage line. As a result, the test voltage level at the address pin is decayed. The tester determines the memory cell sub-array or sub-arrays not rescued by the redundant row or rows as by step S1.

Subsequently, the semiconductor dynamic random access memory devices are classified by available sub-arrays 111 to 114. There are fourteen combinations of available sub-arrays 111 to 114, and these combinations form the fourteen classes "1-2-3", "1-2-4", "1-3-4", "2-3-4", "1-2", "1-3", "1-4", "2-3", "2-4", "3-4", "1", "2", "3" and "4". The numerals are indicative of the available memory cell sub-arrays. For example, a semiconductor dynamic random access memory device classified in "1-2-3" has three available memory cell sub-arrays 111, 112 and 113. However, the memory cell sub-array 114 has defective rows larger than the redundant row 12.

Subsequently, the semiconductor dynamic random access memory devices are classified on the basis of the access time. The semiconductor dynamic random access memory devices of the classes "1-2-3", "1-2-4", "1-3-4" and "2-3-4" are classified into sub-classes "0", "1", "2" and "3" as by step S3. The access times 50 nano-second, 60 nanosecond, 80 nanosecond and over-80 nanosecond are respectively guaranteed in the sub-classes "0" to "3".

The semiconductor dynamic random access memory devices of the classes "1-2" to "3-4" are also classified into sub-classes "3", "4", "5" and "F" also guaranteeing 50 nanosecond, 60 nanosecond, 80 nanosecond and over-80 nanosecond.

The semiconductor dynamic random access memory devices of the classes "1" to "4" are also classified into sub-classes "6", "7", "8" and "F" also guaranteeing 50 nanosecond, 60 nanosecond, 80 nanosecond and over-80 nanosecond.

A program sequence for the second classification at step S3 is only carried out a key-manipulation for masking the address buffer circuits associated with the broken fuse element F12, and a separation of the program is not necessary.

Thus, the semiconductor dynamic random access memory devices are classified into ten sub-classes "0" to "8" and "F", and the manufacturer marks the packages with symbols respectively indicating the ten sub-classes.

As will be appreciated from the foregoing description, the dynamic random access memory device according to the present invention is easily classified after the packaging.

Although a particular embodiment of the present invention has been shown and described, it will be obvious to those skilled in the art that various changes and modifications may be made without departing from the spirit and scope of the present invention. For example, the present invention is applicable to other semiconductor memory devices such as, for example, a static random access memory device, a mask ROM, an electrically programmable read only memory device and an electrically erasable and programmable read only memory device.

Moreover, the address buffer circuits are used for memorizing the pieces of information for the available memory cell sub-arrays in the embodiment described hereinbefore. However, signal buffer circuits assigned to control or data signals are available for memorizing the pieces of information insofar as the signal buffer circuits are corresponding to the memory cell sub-arrays.

What is claimed is:

1. A semiconductor memory device comprising:
    a) a memory cell array divided into a plurality of memory cell sub-arrays each implemented by a plurality of addressable memory cells for storing data bits, respectively;
    b) a plurality of interface circuits respectively coupled to signal pins for communicating with said semiconductor memory device, and having first interface circuits operative to produce first internal signals for selectively enabling said plurality of memory cell sub-arrays to be accessible, second interface circuits operative to produce second internal signals for enabling said plurality of addressable memory cells to be accessible and at least one third interface circuit for a data signal;
    c) an addressing system responsive to said first internal signals and said second internal signals for selectively coupling the addressable memory cells of each of said memory cell sub-arrays to said at least one third interface circuit for delivering said data signal; and
    d) a plurality of information storage circuits sharing respective signal pins with predetermined interface circuits selected from said plurality of interface circuits, and respectively associated with said plurality of memory cell sub-arrays for storing test information of each of said memory cell sub-arrays which is prohibited from access for data storage.

2. The semiconductor memory device as set forth in claim 1, in which said first interface circuits and said second interface circuits are address buffer circuits, and said predetermined interface circuits are selected from said first interface circuits and said second interface circuits.

3. The semiconductor memory device as set forth in claim 1, in which each of said plurality of information storage circuits comprises:
    a fuse element electrically connected to one of said respective signal pins for storing test information indicating the associated memory cell sub-array is accessible,
    a step-down circuit coupled to said fuse element, and producing a step-down voltage from a voltage level supplied through said fuse element, and
    a comparator operative to compare said step-down voltage with a high voltage level of a signal supplied to said one of said signal pins, and providing a current path from said step-down circuit to a discharging line when said voltage level supplied from said fuse element is higher than said high voltage level.

4. The semiconductor memory device as set forth in claim 1, further comprising
    e) a plurality of redundant memory cell groups selectively associated with said plurality of memory cell sub-arrays, defective memory cell groups of said plurality of memory cell sub-arrays being replaced with the associated redundant memory cell group, and
    f) a redundant circuit storing addresses assigned to said defective memory cell groups, and comparing an address indicated by said first internal signals and said second internal signals with said addresses stored therein for replacing one of said defective memory cell groups with one of said redundant memory cell groups.

5. The semiconductor memory device as set forth in claim 1, in which each of said plurality of information storage circuits is coupled to a protective resistor connected between said respective signal pin and said predetermined interface circuit.

6. A semiconductor memory device selectively entering into a standard mode for a data access and a diagnostic mode for inspections, comprising:
    a) a plurality of memory cell sub-arrays each having a plurality of regular memory cell groups and at least one redundant memory cell group, said plurality of regular memory cell groups of each memory cell sub-array being selectively replaced with said associated at least one redundant memory cell group;
    b) a redundant circuit storing addresses of each of the regular memory cell groups replaced with said at least one redundant memory cell group in said diagnostic mode, and comparing an address indicated by first internal address signals and second internal address signals with said addresses stored therein for producing a hit signal indicative of coincidence between said address and one of said addresses;
    c) a plurality of address buffer circuits respectively coupled to address pins supplied with external address bits in said standard mode, and producing said first internal address signals indicative of one of said memory cell sub-arrays to constitute a selected memory cell sub-array, and said second internal address signals indicative of one of said regular memory cell groups of the selected memory cell sub-array;
    d) an addressing system responsive to said first internal address signals and said second internal address signals in the absence of said hit signal for selectively enabling said regular memory cell groups of said plurality of memory cell sub-arrays to become accessible in said standard mode, said addressing system being further responsive to said hit signal for selectively enabling said at least one redundant memory cell group of each memory call sub-array to become accessible in said standard mode; and
    e) a plurality of information storage circuits respectively associated with said plurality of memory cell sub-arrays, and electrically connected to predetermined address pins selected from said address pins, each of said plurality of information storage circuits being operative to store test information indicative of inaccessibility of the associated memory cell sub-array when said associated memory cell sub-array contains more defective regular memory cell groups than cells available for substitution in said at least one redundant memory cell group,
    each of said plurality of information storage circuits having
    a fuse element electrically connected to the associated address pin, and broken when said associated memory cell sub-array contains more defective regular memory cell groups than cells available for substitution in said at least one redundant memory cell group,
    a step-down circuit coupled to said fuse element for producing a step-down voltage from a voltage supplied from said associated address pin through said fuse element, and a comparator coupled to said step-down circuit and a source of a voltage level indicative of a limit voltage of a voltage range of said external address bits for comparing said step-down voltage with said voltage level, said comparator providing a current path to a discharging line when said step-down voltage is out of said voltage range.

* * * * *